United States Patent [19]
Graettinger et al.

[11] Patent Number: 6,146,961
[45] Date of Patent: *Nov. 14, 2000

[54] PROCESSING METHODS OF FORMING A CAPACITOR

[75] Inventors: Thomas M. Graettinger; Paul J. Schuele; Pierre C. Fazan, all of Boise; Li Li; Zhiqiang Wu, both of Meridian; Kunal R. Parekh; Thomas Arthur Figura, both of Boise, all of Id.

[73] Assignee: Micron Technology, Inc., Boise, Id.

[*] Notice: This patent issued on a continued prosecution application filed under 37 CFR 1.53(d), and is subject to the twenty year patent term provisions of 35 U.S.C. 154(a)(2).

[21] Appl. No.: 08/880,356

[22] Filed: Jun. 23, 1997

[51] Int. Cl.$^7$ .................................................... H01L 21/20
[52] U.S. Cl. .......................................... 438/396; 438/253
[58] Field of Search .................................... 438/253, 254, 438/255, 252, 396, 397, 398, 399, 240

[56] References Cited

U.S. PATENT DOCUMENTS

| | | | |
|---|---|---|---|
| 5,126,280 | 6/1992 | Chan et al. | 438/253 |
| 5,126,916 | 6/1992 | Tseng | 438/253 |
| 5,150,276 | 9/1992 | Gonzalez et al. | 361/313 |
| 5,364,809 | 11/1994 | Kwon et al. | 438/240 |
| 5,438,011 | 8/1995 | Blalock . | |
| 5,661,320 | 8/1997 | Moriya | 257/296 |
| 5,723,889 | 3/1998 | Choi et al. | 257/329 |
| 5,821,139 | 10/1998 | Tseng | 438/240 |
| 5,837,577 | 11/1998 | Cherng | 438/253 |

FOREIGN PATENT DOCUMENTS 3-257859  11/1991  Japan .

*Primary Examiner*—Tuan H. Nguyen
*Attorney, Agent, or Firm*—Wells, St. John, Roberts, Gregory & Matkin P.S.

[57] ABSTRACT

Capacitors and methods of forming capacitors are described. According to one implementation, a capacitor opening is formed over a substrate node location. Electrically conductive material is subsequently formed within the capacitor opening and makes an electrical connection with the node location. A protuberant insulative structure is formed within the capacitor opening and includes a lateral outer surface at least a portion of which is supported by and extends elevationally below adjacent conductive material. First and second capacitor plates and a dielectric layer therebetween are formed within the capacitor opening and supported by the protuberant structure. In one aspect, the conductive material is formed to occupy less than all of the capacitor opening and to leave a void therewithin, with the protuberant structure substantially, if not completely filling in the void. In another aspect, the conductive material is formed to occupy less than all of the capacitor opening and to leave a void therewithin, with the protuberant structure only partially filling in the void to provide a tubular structure.

47 Claims, 8 Drawing Sheets

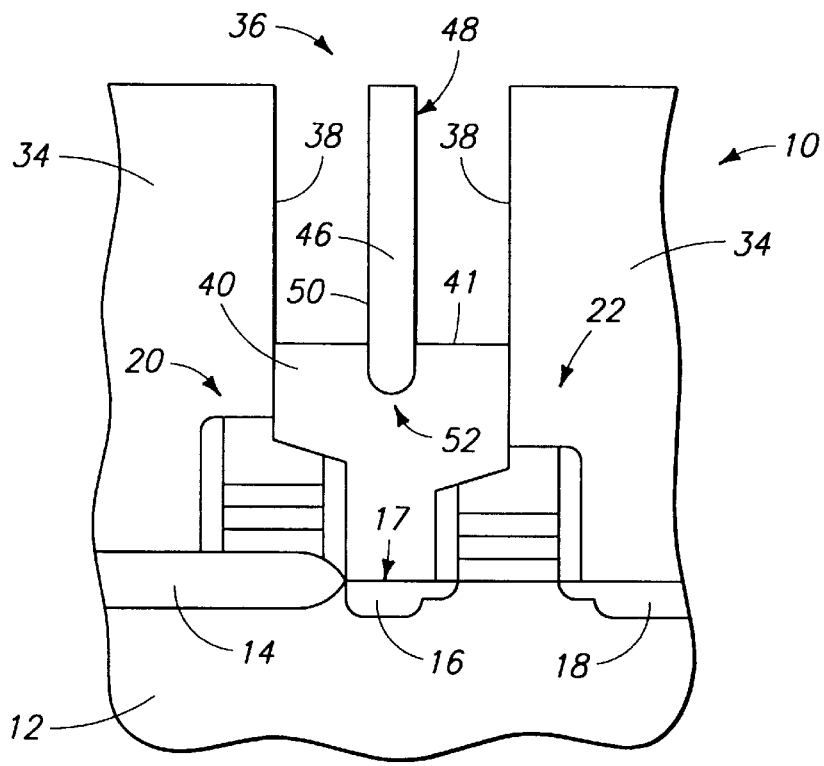
_Fig 5_
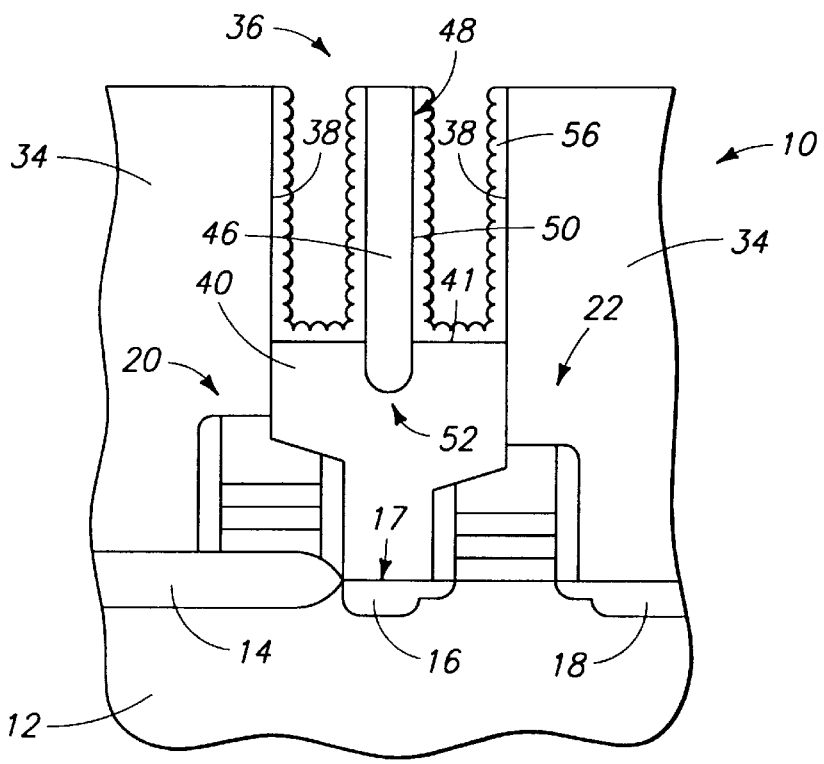
_Fig 6_

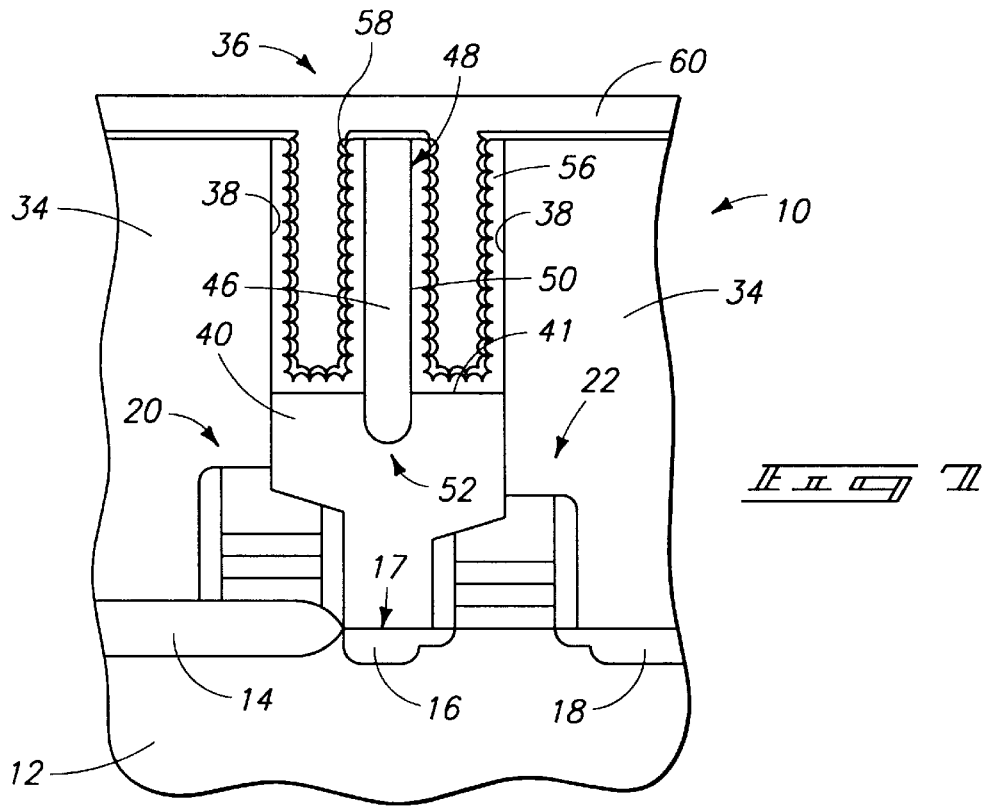
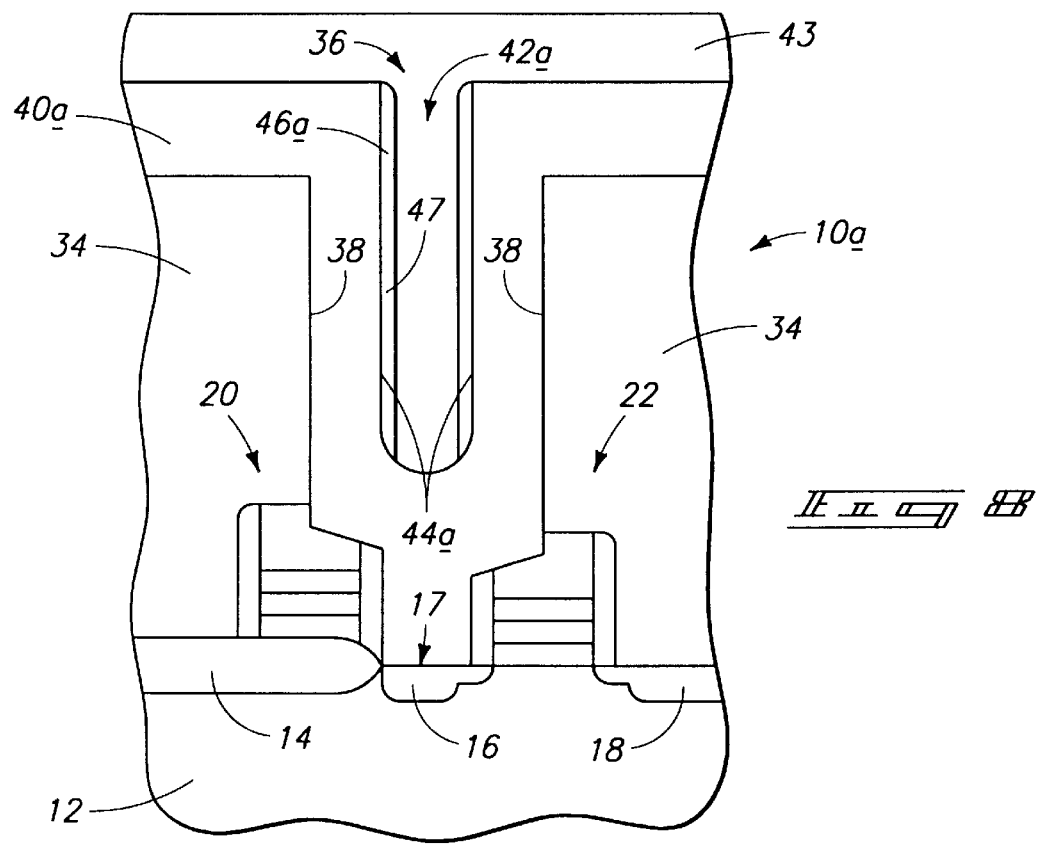

PROCESSING METHODS OF FORMING A CAPACITOR

TECHNICAL FIELD

This invention relates generally to capacitors and to capacitor formation in semiconductor wafer processing.

BACKGROUND OF THE INVENTION

As DRAMs increase in memory cell density, there is a continuing challenge to maintain sufficiently high storage capacitance despite decreasing cell area. Additionally, there is a continuing goal to further decrease cell area.

The principle way of increasing cell capacitance is through cell structure techniques. Such techniques include three-dimensional cell capacitors, such as trenched or stacked capacitors. This invention concerns three-dimensional cell capacitor constructions and methods of forming the same.

SUMMARY OF THE INVENTION

Capacitors and methods of forming capacitors are described. According to one implementation, a capacitor opening is formed over a substrate node location. Electrically conductive material is subsequently formed within the capacitor opening and makes an electrical connection with the node location. A protuberant insulative structure is formed within the capacitor opening and includes a lateral outer surface at least a portion of which is supported by and extends elevationally below adjacent conductive material. In one aspect, the conductive material is formed to occupy less than all of the capacitor opening and to leave a void therewithin, with the protuberant structure substantially, if not completely filling in the void. In another aspect, the conductive material is formed to occupy less than all of the capacitor opening and to leave a void therewithin, with the protuberant structure only partially filling in the void to provide a tubular structure. First and second capacitor plates and a dielectric layer therebetween are formed within the capacitor opening and supported by the protuberant structure.

BRIEF DESCRIPTION OF THE DRAWINGS

Preferred embodiments of the invention are described below with reference to the following accompanying drawings.

FIG. 5 is a view of the FIG. 1 wafer fragment at a processing step subsequent to that shown by FIG. 4.

FIG. 6 is a view of the FIG. 1 wafer fragment at a processing step subsequent to that shown by FIG. 5.

FIG. 7 is a view of the FIG. 1 wafer fragment at a processing step subsequent to that shown by FIG. 6.

FIG. 8 is a diagrammatic sectional view of a semiconductor wafer fragment at one processing step in accordance with another implementation of the invention.

DETAILED DESCRIPTION OF THE PREFERRED EMBODIMENTS

This disclosure of the invention is submitted in furtherance of the constitutional purposes of the U.S. Patent Laws "to promote the progress of science and useful arts" (Article 1, Section 8).

Figure 1:
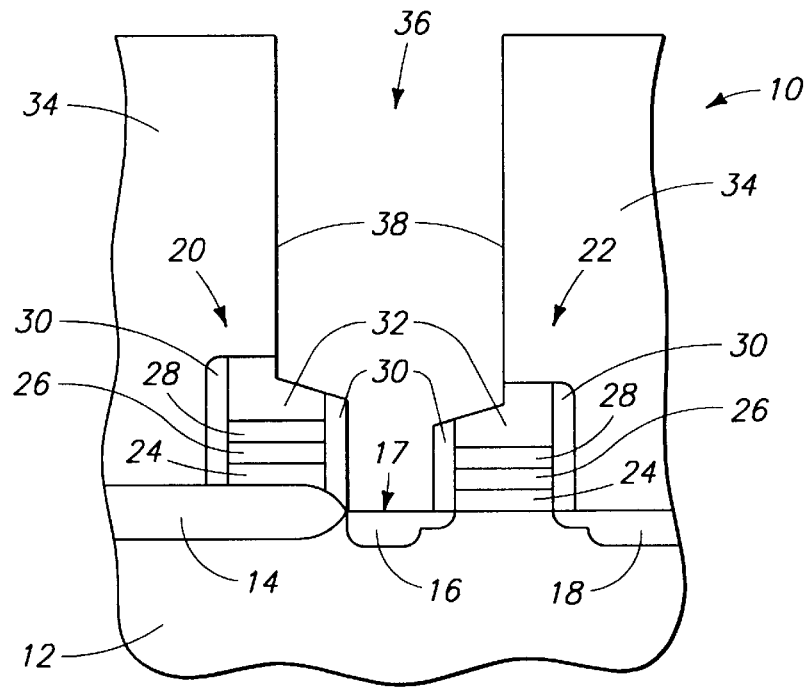
FIG. 1 is a diagrammatic sectional view of a semiconductor wafer fragment at one processing step in accordance with one implementation of the invention.

Referring to FIG. 1, a semiconductor wafer fragment in process is indicated generally with reference numeral 10 and comprises a semiconductive substrate 12. In the context of this document, the term "semiconductive substrate" is defined to mean any construction comprising semiconductive material, including, but not limited to, bulk semiconductive materials such as a semiconductive wafer (either alone or in assemblies comprising other materials thereon), and semiconductive material layers (either alone or in assemblies comprising other material). The term "substrate" refers to any supporting structure, including, but not limited to, the semiconductive substrates described above. The illustrated substrate includes an isolation region defined by isolation oxide 14 which is formed adjacent a substrate active area which includes diffusion regions 16, 18 received therein. A pair of conductive lines 20, 22 are formed over substrate 12 and constitute part of the preferred DRAM circuitry. Conductive lines 20, 22 are of standard construction and include an oxide layer 24, a polysilicon layer 26, and a silicide layer 28. Conductive lines 20, 22 also include respective sidewall spacers 30 and respective protective caps 32.

An electrically insulative layer 34 is formed over substrate 12 and conductive lines 20, 22. Layer 34 preferably comprises an oxide material, such as borophosphosilicate glass (BPSG). An initial capacitor contact opening 36 is etched or otherwise formed through layer 34 to the outer surface of diffusion region 16, which for the purposes of the continuing discussion comprises an example node location 17. Capacitor contact opening 36 constitutes a container relative to which a storage capacitor will be formed. Such container can be formed by a selfaligned contact etch which contacts the active area region as shown. Alternately, the container can make an electrical connection with a previously formed plug of conductive material such as polysilicon, which in turn, forms a connection with the active area region of the substrate.

As formed, capacitor contact opening 36 has an inner sidewall surface area 38 defined by insulative layer 34 and spaced from node location 17. Accordingly, such defines a capacitor opening which is disposed elevationally over node location 17.

Figure 2:
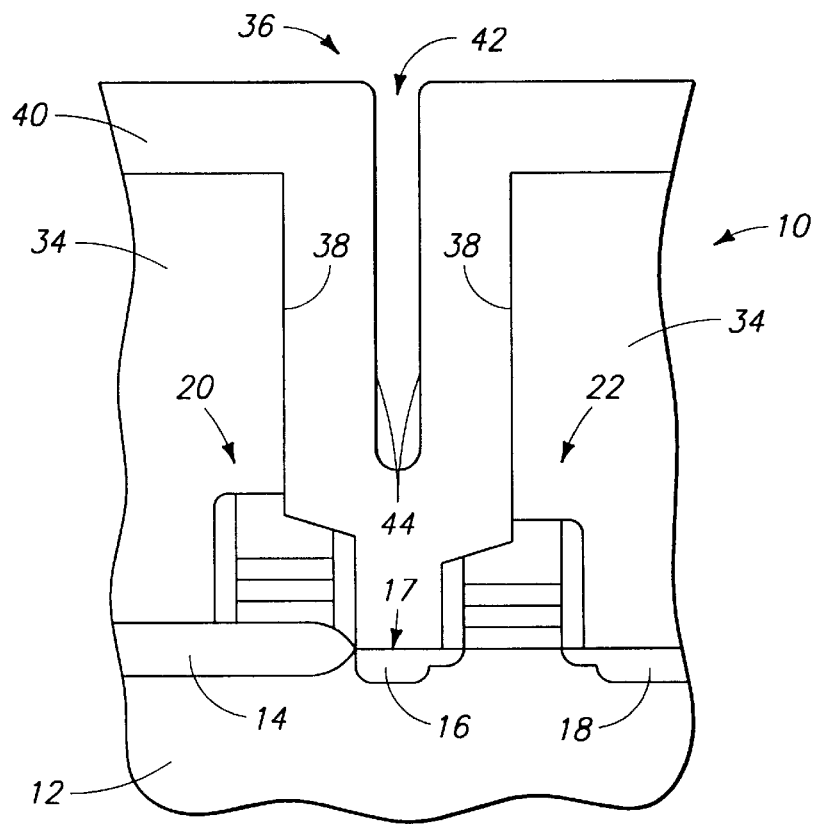
FIG. 2 is a view of the FIG. 1 wafer fragment at a processing step subsequent to that shown by FIG. 1.

Referring to FIG. 2, a layer of electrically conductive material 40 is formed over substrate 12 and within capacitor opening 36 and makes electrical connection with node location 17. A preferred conductive material is in situ doped polysilicon. Conductive material 40 is formed over inner sidewall surface area 38 and preferably occupies less than all of capacitor opening 36 as shown. Accordingly, such leaves a void 42 outwardly of node location 17 which is defined, at least in part, by a conductive material sidewall 44. Alternately considered, void 42 and sidewall 44 define a conductive female receptacle or pocket of female conductive material which is formed within capacitor opening 36. In the illustrated example, at least some portion of the conductive receptacle or pocket material makes an electrical connection with node location 17. Such electrical connection can be either a direct connection, as is shown, or an indirect connection through a conductive plug as mentioned above. Conductive material 40 can be, and preferably is deposited to a thickness which both achieves an adequate electrical connection between a to-be-formed capacitor and node location 17, and enables selected conductive material to be used as a sacrificial spacer layer as will become apparent below.

Figure 3:
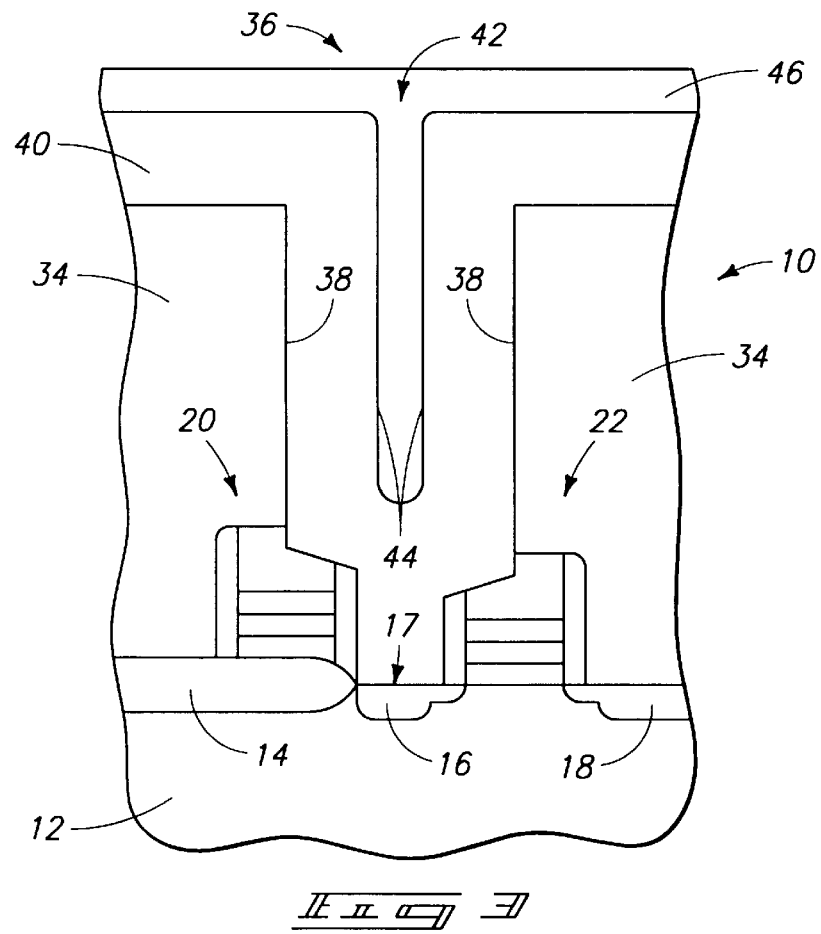
FIG. 3 is a view of the FIG. 1 wafer fragment at a processing step subsequent to that shown by FIG. 2.

Referring to FIG. 3, a layer of insulative material 46 is deposited or formed over the substrate and within at least a portion, and preferably the entirety of void or pocket 42. In this illustrated example, portions of insulative material 46 are formed adjacent and in contact with conductive material 40. Accordingly, insulative material is formed over conductive material sidewall 44 and completely fills void 42. Suitable materials for insulative material 46 include oxides of silicon, i.e. $SiO_2$, and nitrides of silicon, i.e. $Si_3N_4$, with the latter being preferred for achieving desirable step coverage. Of course, other suitable insulative materials can be used.

Figure 4:
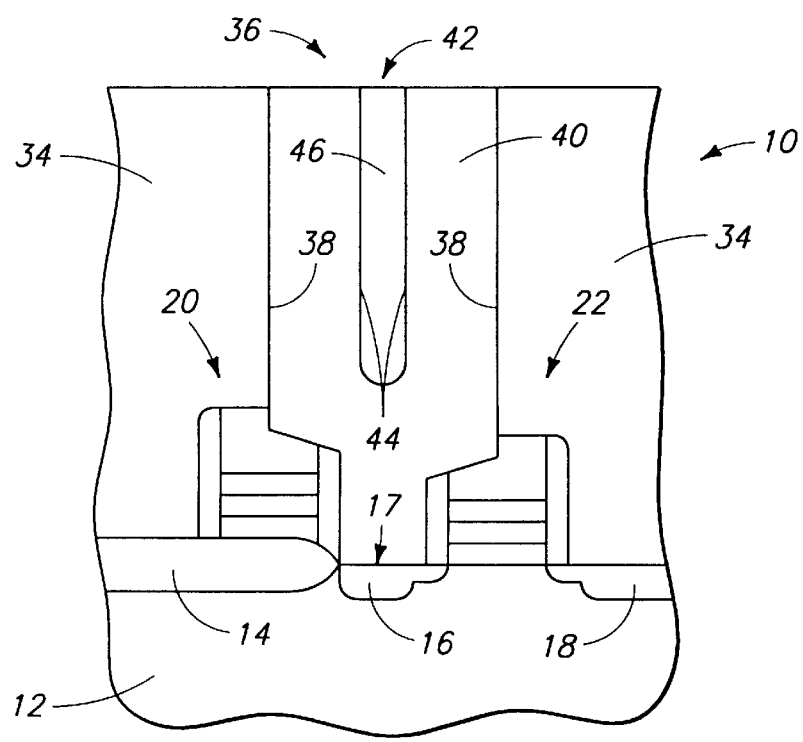
FIG. 4 is a view of the FIG. 1 wafer fragment at a processing step subsequent to that shown by FIG. 3.

Referring to FIG. 4, portions of insulative material 46 and conductive material 40 are preferably removed to a degree sufficient to leave behind only material which was deposited or formed within capacitor contact opening 36. Accordingly, only insulative material which was formed or deposited within that portion of void or pocket 42 disposed within contact opening 36 remains. The removal of such material can be effectuated by conventional techniques such as abrasion of the substrate by chemical mechanical polishing or through a dry etch back process. Other techniques can, of course, be used.

Referring to FIG. 5, an amount of conductive material 40 laterally adjacent inner sidewall surface area 38 is removed to define a conductive upper surface 41 and to expose a protuberant insulative support structure or male projection 48 which is formed within capacitor opening 36. Upper surface 41 is elevationally spaced from node location 17 by virtue of remaining conductive material 40 therebetween. In one aspect, upper surface 41 is generally planar. Structure or projection 48 defines a column of insulative material which is spaced from inner sidewall surface area 38 as shown, and which includes a lateral outer surface 50 at least a portion of which is supported by and extends elevationally below adjacent electrically conductive material 40. According to one aspect, structure or projection 48 includes an interior region laterally adjacent outer surface 50 which is substantially, if not completely filled with insulative material. Accordingly, the lateral outer surface and filled interior region are supported by conductive material. According to another aspect, structure or projection 48 is formed from decomposition of tetraethyl orthosilicate (TEOS) with a resulting construction which has a key hole void at or adjacent the top of the structure. Accordingly, such structure or projection is not completely filled with insulative material.

In a preferred implementation, conductive material 40 (FIG. 4) is removed substantially selectively relative to insulative material 46 and to a degree which is sufficient to expose sidewall surface area 38 laterally adjacent lateral outer surface 50. Removal of conductive material 40 is effectuated through a wet or dry etch thereof (with a dry etch being preferred) relative to insulative material 46 and insulative material 34. Where insulative material 46 comprises an oxide of silicon, such etch would accordingly be selective relative to the oxide of silicon. Where insulative material 46 comprises a nitride of silicon, such etch would accordingly be selective relative to the nitride of silicon. Such etch is also preferably selective relative to insulative material 34. Exemplary etch chemistries include one or more of the following: $TMAH/H_2O$ mix, nitric/hydrofluoric mix, 15% aqueous KOH, or 15% aqueous choline.

Where conductive material 40 comprises polysilicon and the removal thereof is desired to be selective to oxide, the following etch chemistries are preferred: chlorine-based chemistries such as $Cl_2$, $BCl_3$, $SiCl_4$, or HCl; bromine-based chemistries such as HBr; and/or combinations of the above, e.g. HBr+HCl. Where conductive material 40 comprises polysilicon and the removal thereof is desired to be selective to nitride, a wet etch thereof is more preferred.

In this illustrated example, and because no etch stop layer is utilized, the etching of conductive material 40 is preferably a timed etch which is conducted to a degree sufficient to leave at least some conductive material laterally outward of and below structure or projection 48 to support the same. Accordingly, structure or projection 48 is supported interiorly of capacitor opening 36 with conductive material which forms an electrical connection or contact with substrate diffusion region 16. The portion of structure or projection 48 which extends a selected distance elevationally below conductive material upper surface 41 is defined by the duration of the timed etch mentioned above. Accordingly, the structure or projection is outwardly supported by that portion of conductive material 40 which is not removed, and hence extends elevationally outwardly or above and below surface 41.

Alternately considered, structure 48 defines an upright insulative structure which includes lateral outer sidewall surface 50 which is disposed elevationally outwardly of an insulative structure bottom portion or base 52. Bottom portion 52 and at least a portion of the lateral outer sidewall surface are supported with conductive material 40 which forms an electrical connection with node location 17. Lateral outer surface 50 constitutes an insulative surface which is disposed laterally adjacent insulative sidewall 38. Insulative surface 50 includes an area, at least a portion of which is supported with conductive material 40. In the illustrated example, the conductive material which supports such insulative surface area extends laterally between insulative surface 50 and insulative sidewall 38. In a preferred embodiment, structure, projection, or column 48 is formed to define an elongate column. Column 48 can have circular and non-circular transverse cross sections.

Referring to FIG. 6, a first capacitor plate structure 56 is formed within capacitor opening 36 at least a portion of which is supported by structure 48. Accordingly, at least some of plate structure 56 is formed over capacitor opening sidewall surface 38 and protuberant structure lateral outer surface 50. First capacitor plate structure 56 can comprise any suitable material. Exemplary and preferred materials include polysilicon, polysilicon in combination with a hemispherical grain (HSG) polysilicon, or in situ doped HSG. The selected material is preferably formed over the substrate and deposited within contact opening 36 to a thickness from between about 300 to 600 Angstroms. Subsequently, such material is planarized as by suitable mechanical abrasion of the substrate to remove such material from outwardly of contact opening 36. Such material can also be removed through a dry etch back process. Preferably, during such removal, capacitor contact opening 36 is filled with photoresist to prevent removed particles from falling into the opening during planarization or to prevent etching of the material inside opening 36 during the dry etch back process. The photoresist is subsequently removed.

Referring to FIG. 7, cell nitride is deposited over first capacitor plate structure 56 followed by an oxidation step to form the illustrated ONO dielectric layer 58. Subsequently, a second capacitor plate structure 60 is provided or formed operatively adjacent the first capacitor plate structure 56 to provide a storage cell which, in the illustrated and preferred embodiment, constitutes a portion of DRAM circuitry. Typically, such second capacitor plate structure comprises polysilicon. Subsequent processing to form bit line contact plugs and bit lines can take place in a manner which will be understood by one of skill in the art.

Referring to FIG. 8, an alternate preferred embodiment is set forth generally at 10a. Like numbers from the first described embodiment are utilized where appropriate, with differences being indicated with the suffix "a" or with different numerals. Accordingly, a layer of conductive material 40a is formed within capacitor opening 36 to occupy less than all of the capacitor opening and to leave a void or female receptacle 42a outwardly of node location 17. An insulative material layer 46a, preferably comprising a nitride material or conformal oxide, is formed over substrate 12 and preferably within capacitor opening 36. Portions of the insulative material are subsequently removed to leave remnant insulative material 47 in the form of a spacer (preferably a hollowed annular column or tube) over conductive material sidewall 44a. In the illustrated and preferred embodiment, insulative material 46a is anisotropically etched adjacent conductive material 40a to leave the spacer thereover. Accordingly, such etching forms a tubular column of insulative material within capacitor opening 36. Subsequently, a photoresist material 43 can be provided within void or receptacle 42a and over conductive material 40a.

Figure 9:
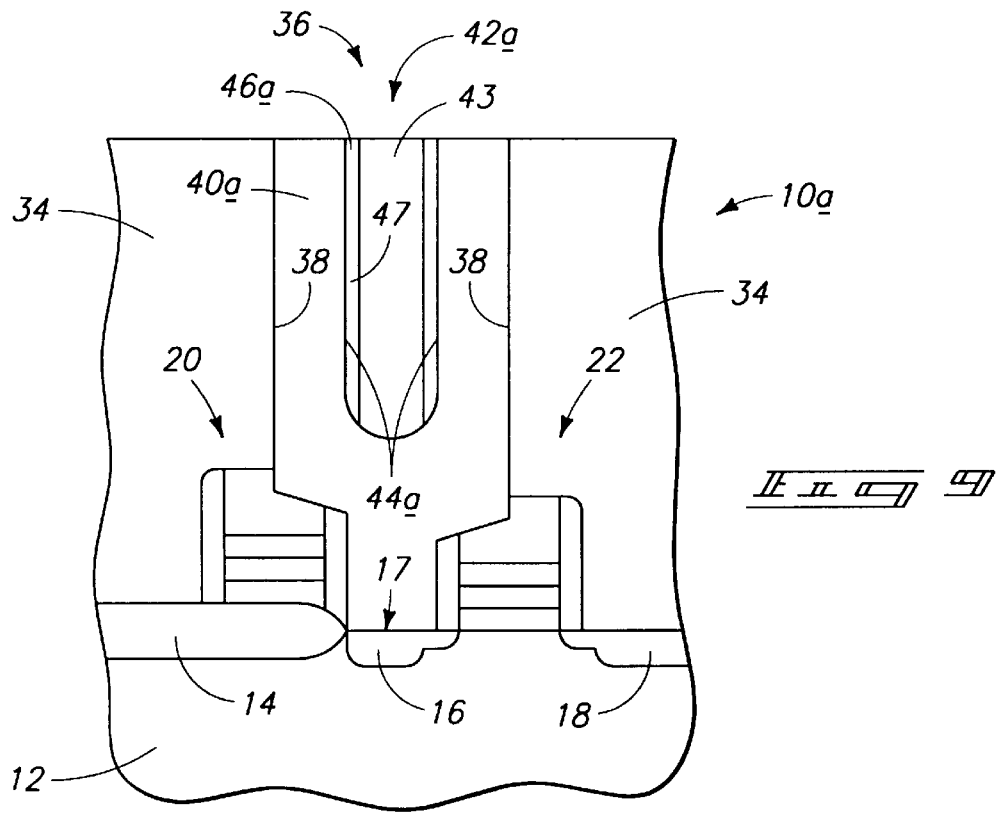
FIG. 9 is a view of the FIG. 8 wafer fragment at a processing step subsequent to that shown by FIG. 8.

Referring to FIG. 9, portions of conductive material 40a and insulative material 46a can be removed as by suitable resist etch back techniques or abrasion of substrate 12. Such constitutes planarizing or etching back conductive material 40a and insulative material 46a relative to the upper surface of insulative material 34. The above-mentioned photoresist 43 which is provided into receptacle 42a prevents debris from falling into receptacle 42a during the planarization or etch back. Subsequently, material 40a is etched selectively relative to the material from which spacer 47 was formed and insulative material 34. The photoresist can then be stripped through conventional means to give the FIG. 10 construction. Accordingly, such defines a protuberant structure, projection or support column 48a of insulative material.

Figure 10:
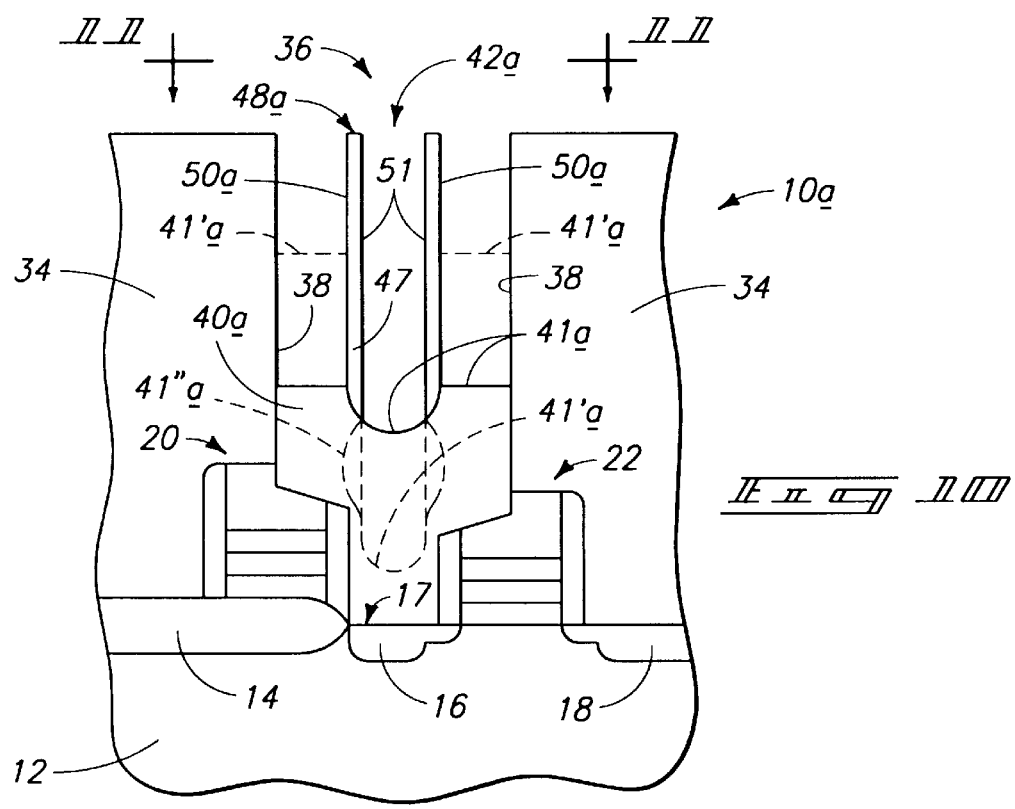
FIG. 10 is a view of the FIG. 8 wafer fragment at a processing step subsequent to that shown by FIG. 9.

Referring to FIG. 10, the removing of conductive material 40a exposes a column surface 50a laterally adjacent capacitor opening inner sidewall surface area 38. In the illustrated example, at least a portion of column 48a and preferably all of such column is tubular and includes an exposed inside or inner surface 51. Structure or column 48a constitutes insulative material which partially fills female receptacle 42a. In one aspect, conductive material 40a defines an upper surface 41a which includes a portion which is generally non-planar laterally inwardly of inner surface 51. In another aspect, a portion of upper surface 41a laterally outwardly of inner surface 51 is generally planar.

As an alternative to the above-described photoresist/etch back process which forms column 48a, such can be formed without the provision of any photoresist. It will be appreciated that by controlling the ultimate height of surface 41a relative to node location 17, material 40a can be recessed in a manner which removes an even greater portion of such material which is disposed laterally inwardly of surface 51. Of course, enough of material 40a would remain so that node location 17 is not exposed and column 48a is adequately supported. This would enable additional surface area to be gained for the purpose of increasing the capacitance of the storage capacitor. This would, in one implementation, define an upper surface 41'a and result in removal of an additional amount of material 40a inwardly of and below surface 51, also designated at 41'a. One manner of effectuating the 41'a construction is through a suitable anisotropic etch of material 40a which is conducted substantially selective relative to insulative material 34 and spacer 47. In another implementation, such etch can include an isotropic etch of material 40a to produce a somewhat outwardly rounded or bulbed construction indicated at 41"a. Moreover, in another implementation, such etch of material 40a can be entirely isotropic and conducted substantially selective relative to insulative material 34 and spacer 47.

Figure 11:
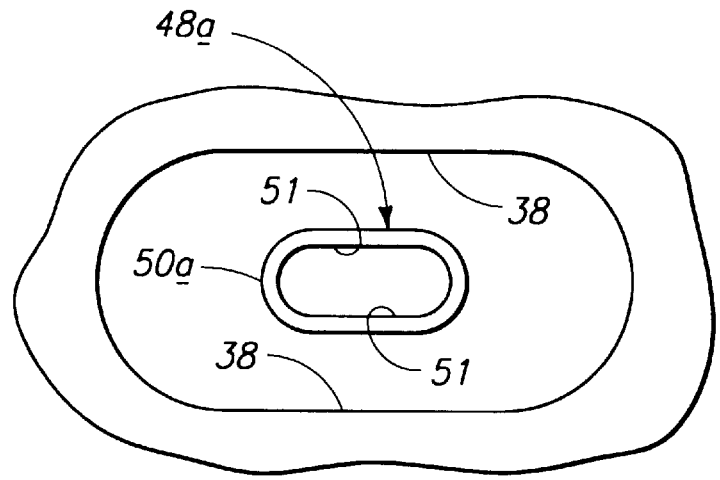
FIG. 11 is a view taken along line 11—11 in FIG. 10.

Referring to FIG. 11, the tubularity of structure or column 48a is more readily apparent.

Figure 12:
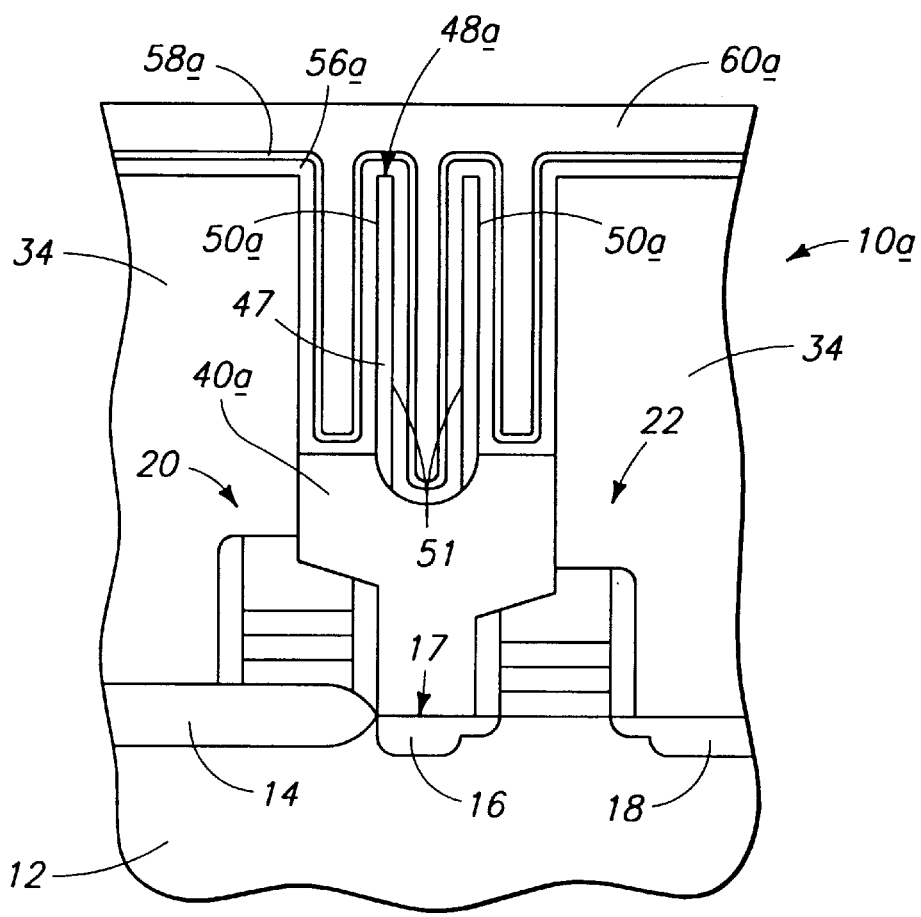
FIG. 12 is a view of the FIG. 8 wafer fragment at a processing step subsequent to that shown by FIG. 10.

Referring to FIG. 12, a first capacitor plate structure 56a is formed within the capacitor opening and preferably over and within tubular projection 48a. In the illustrated example, such plate structure is formed over outer surface 50a and inner or inside surface 51 as shown. Accordingly, such plate structure is formed over lateral outer sidewall surface 50a which is unsupported with any of the conductive material. Subsequently, a dielectric layer 58a and a second capacitor plate structure 60a are provided or formed operatively adjacent first capacitor plate structure 56a.

Figure 13:
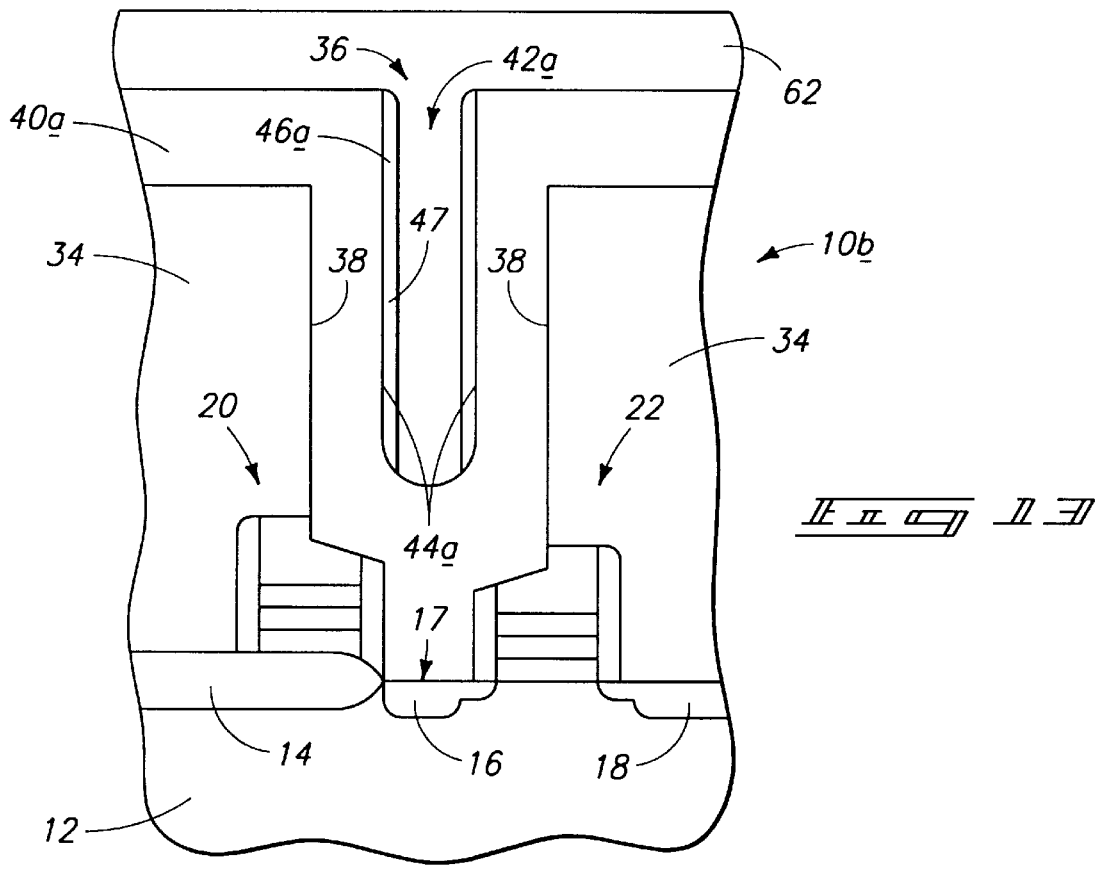
FIG. 13 is a diagrammatic sectional view of a semiconductor wafer fragment at one processing step in accordance with another implementation of the invention.

Referring to FIG. 13, another alternate preferred embodiment is set forth generally at 10b. Like numbers from the embodiment of FIGS. 9–12 are utilized where appropriate, with differences being indicated with the suffix "b" or with different numerals. Processing in accordance with this aspect of the invention takes place in substantially the same manner up to and including the resultant FIG. 9 construction. Subsequently, a layer 62 comprising conductive material is deposited or otherwise formed over substrate 12. Preferably layer 62 material completely fills void or pocket 42a. Accordingly, such constitutes completely filling an area interiorly of remnant spacer material 47 with conductive material. An exemplary material for layer 62 comprises polysilicon.

Figure 14:
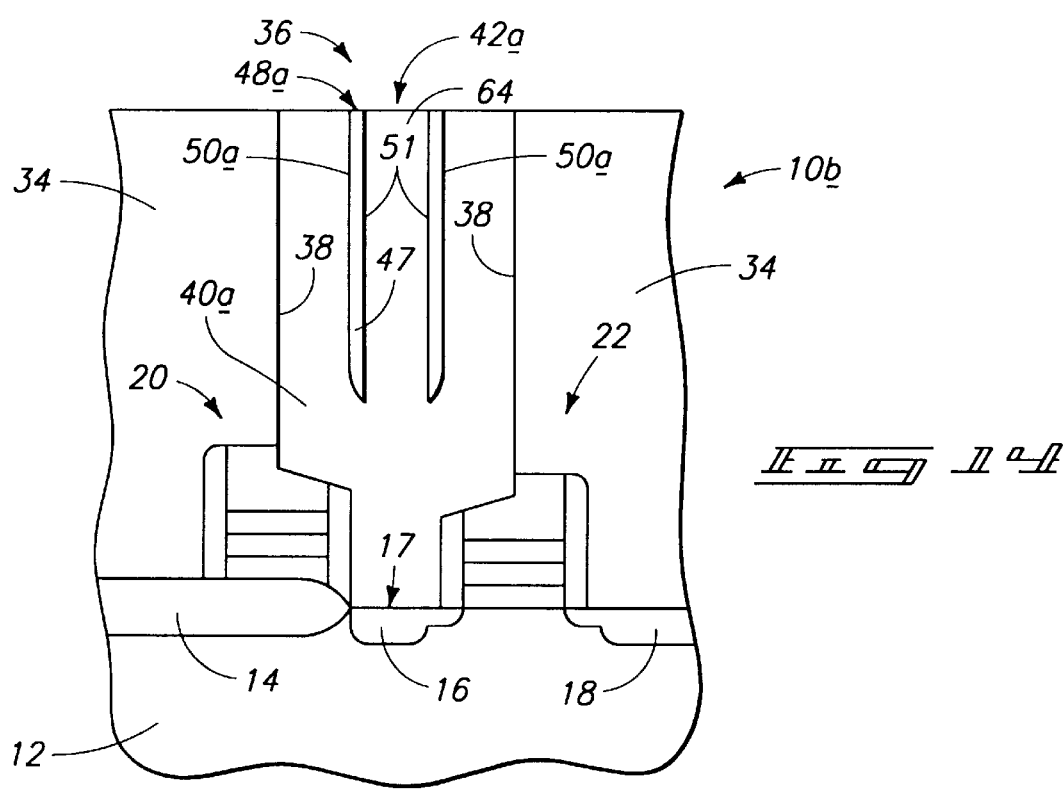
FIG. 14 is a view of the FIG. 13 wafer fragment at a processing step subsequent to that shown by FIG. 13.

Referring to FIG. 14, layer 62, layer 40a, and portions of remnant spacer material 47 are planarized as by suitable mechanical abrasion of substrate 12. Such leaves a core 64 of conductive material interiorly of remnant spacer material 47. An exemplary abrading process is chemical mechanical polishing.

Figure 15:
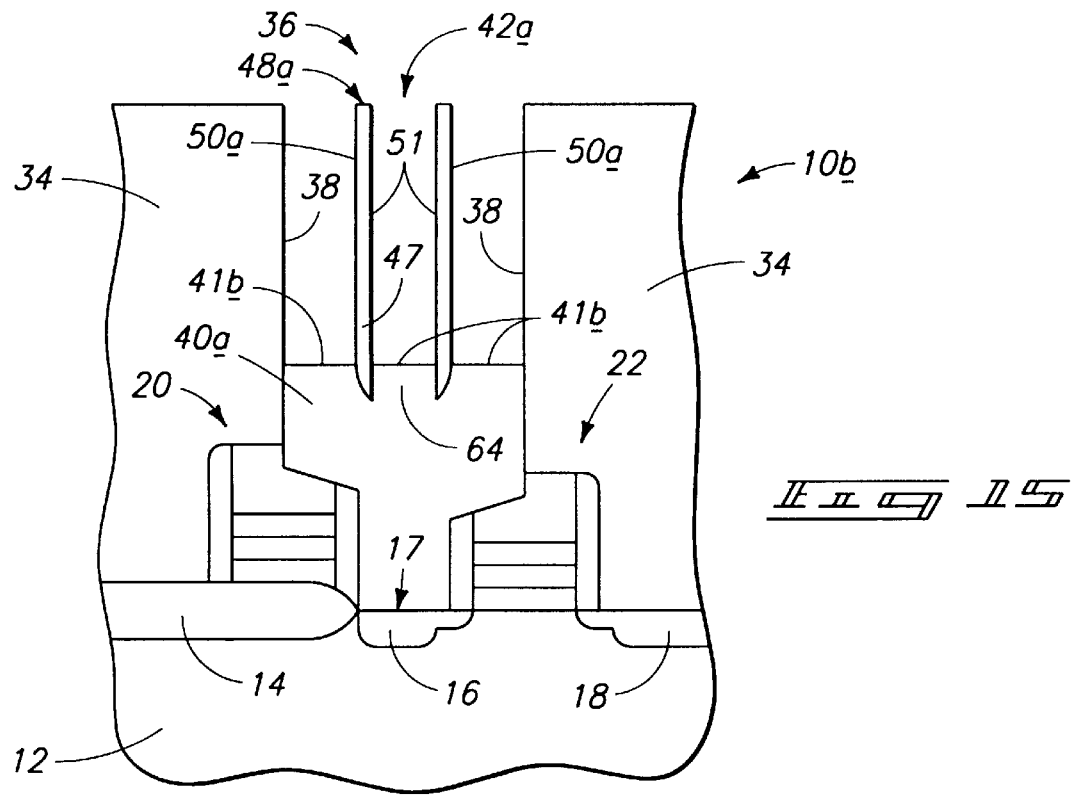
FIG. 15 is a view of the FIG. 13 wafer fragment at a processing step subsequent to that shown by FIG. 14.

Referring to FIG. 15, the conductive material comprising both layer 40a and core 64 is selectively removed relative to structure, projection, or column 48a to expose a column surface 50a laterally adjacent capacitor opening inner sidewall surface area 38. Such can be accomplished with either a wet or a dry etch. In this illustrated example, at least a portion of column 48a and preferably all of such column is tubular and includes an exposed inside or inner surface 51. Structure or column 48a constitutes insulative material which partially fills female receptacle 42a. In one aspect, conductive material 40a defines an upper surface 41b which is generally planar laterally proximate inner surface 51. In another aspect, upper surface 41b includes portions which are generally planar both laterally inwardly and laterally outwardly of inner surface 51.

Figure 16:
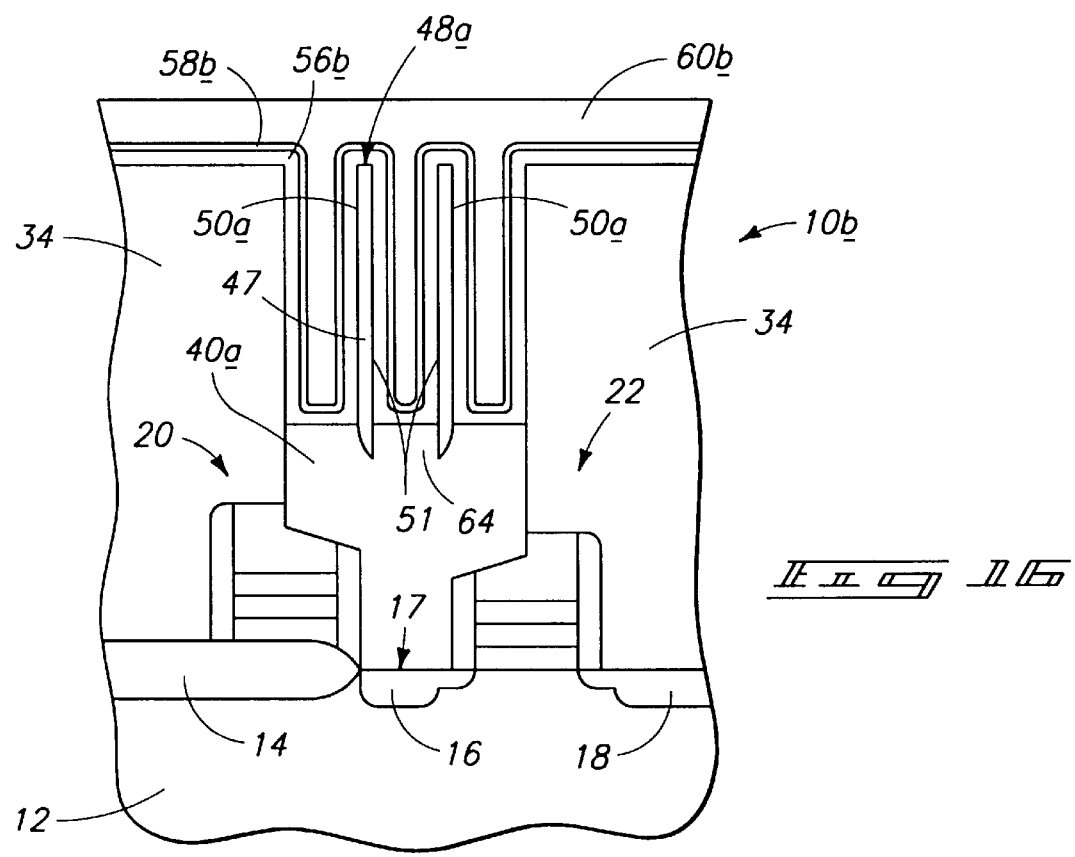
FIG. 16 is a view of the FIG. 13 wafer fragment at a processing step subsequent to that shown by FIG. 15.

Referring to FIG. 16, a first capacitor plate structure 56b is formed within the capacitor opening and preferably over and within tubular projection 48a. In the illustrated example, such plate structure is formed over outer surface 50a, inner or inside surface 51, and the remaining core material 64 as shown. Accordingly, such plate structure is formed over lateral outer sidewall surface 50a which is unsupported with any of the conductive material. Subsequently, a dielectric layer 58b and a second capacitor plate structure 60b are provided or formed operatively adjacent first capacitor plate structure 56b.

The above described invention increases the surface area available for accommodating or supporting storage capacitors. The invention has particular applicability in DRAM circuitry.

In compliance with the statute, the invention has been described in language more or less specific as to structural and methodical features. It is to be understood, however, that the invention is not limited to the specific features shown and described, since the means herein disclosed comprise preferred forms of putting the invention into effect. The invention is, therefore, claimed in any of its forms or modifications within the proper scope of the appended claims appropriately interpreted in accordance with the doctrine of equivalents.

We claim:

1. A method of forming a capacitor comprising:

forming a capacitor opening over a node location;

forming electrically conductive material within the capacitor opening and in electrical connection with the node location;

forming a protuberant structure within the capacitor opening, the protuberant structure having a lateral outer surface at least a portion of which is supported by and extends elevationally below adjacent electrically conductive material;

forming a first capacitor plate structure within the capacitor opening, at least some of the first capacitor plate structure being supported by the protuberant structure; and providing a capacitor dielectric layer and second capacitor plate structure operatively adjacent the first capacitor plate structure and over at least a portion of the protuberant structure.

2. The method of forming a capacitor of claim 1, wherein:

the forming of the electrically conductive material comprises forming a layer of conductive material to occupy less than all of the capacitor opening and to leave a void outwardly of the node location; and the forming of the protuberant structure comprises forming insulative material within at least a portion of the void.

3. The method of forming a capacitor of claim 1, wherein:

the forming of the electrically conductive material comprises forming a layer of conductive material to occupy less than all of the capacitor opening and to leave a void outwardly of the node location; and the forming of the protuberant structure comprises completely filling the void with insulative material.

4. A method of forming a capacitor comprising:

forming a capacitor opening over a node location;

forming electrically conductive material within the capacitor opening and in electrical connection with the node location;

forming a protuberant structure within the capacitor opening, the protuberant structure having a lateral outer surface at least a portion of which is supported by and extends elevationally below adjacent electrically conductive material;

forming a first capacitor plate structure within the capacitor opening, at least some of the first capacitor plate structure being supported by the protuberant structure;

providing a capacitor dielectric layer and second capacitor plate structure operatively adjacent the first capacitor plate structure;

the forming of the electrically conductive material comprises forming a layer of conductive material to occupy less than all of the capacitor opening and to leave a void outwardly of the node location, the void being defined at least in part by a laterally outermost conductive material sidewall; and the forming of the protuberant structure comprises:

forming insulative material within at least a portion of the void and on at least a portion of the laterally outermost conductive material sidewall; and removing a portion of said insulative material to a degree sufficient to leave insulative material on the laterally outermost conductive material sidewall.

5. The method of forming a capacitor of claim 1, wherein:

the forming of the electrically conductive material comprises forming a layer of conductive material to occupy less than all of the capacitor opening and to leave a void outwardly of the node location, the void being defined by a conductive material sidewall; and the forming of the protuberant structure comprises:

forming insulative material within at least a portion of the void and over at least a portion of the conductive material sidewall; and leaving an insulative material spacer over the at least a portion of the conductive material sidewall.

6. The method of claim 4, wherein the removing comprises anisotropically etching the insulative material.

7. A method of forming a capacitor comprising:

forming a capacitor opening over a node location;

forming electrically conductive material within the capacitor opening and in electrical connection with the node location;

forming a protuberant structure within the capacitor opening, the protuberant structure having a lateral outer surface at least a portion of which is supported by and extends elevationally below adjacent electrically conductive material;

forming a first capacitor plate structure within the capacitor opening, at least some of the first capacitor plate structure being supported by the protuberant structure;

providing a capacitor dielectric layer and second capacitor plate structure operatively adjacent the first capacitor plate structure;

the forming of the electrically conductive material comprises forming a layer of conductive material to occupy less than all of the capacitor opening and to leave a void outwardly of the node location, the void being defined by a conductive material sidewall; and the forming of the protuberant structure comprises:
forming insulative material within at least a portion of the void and over at least a portion of the conductive material sidewall;
leaving an insulative material spacer over the at least a portion of the conductive material sidewall; and
forming conductive material over the substrate and to a degree sufficient to completely fill any of the remaining void.

8. The method of claim 7, wherein the leaving comprises anisotropically etching the insulative material.

9. A method of forming a capacitor comprising:

forming a capacitor opening over a node location;

forming electrically conductive material within the capacitor opening and in electrical connection with the node location;

forming a protuberant structure within the capacitor opening, the protuberant structure having a lateral outer surface at least a portion of which is supported by and extends elevationally below adjacent electrically conductive material;

forming a first capacitor plate structure within the capacitor opening, at least some of the first capacitor plate structure being supported by the protuberant structure;

providing a capacitor dielectric layer and second capacitor plate structure operatively adjacent the first capacitor plate structure;

the forming of the electrically conductive material comprises forming a layer of conductive material to occupy less than all of the capacitor opening and to leave a void outwardly of the node location; and the forming of the protuberant structure comprises:
forming insulative material within at least a portion of the void, the insulative material having a base; and
substantially selectively removing an amount of the electrically conductive material relative to the insulative material sufficient to expose a capacitor opening sidewall surface laterally adjacent the protuberant structure lateral outer surface,
wherein the forming of the first capacitor plate structure comprises forming at least some of the plate structure over the capacitor opening sidewall surface and the protuberant structure lateral outer surface.

10. The method of claim 9, wherein the removing further comprises maintaining a portion of the electrically conductive material elevationally outward of the base and supporting the insulative material in an upright position.

11. A method of forming a capacitor comprising:

forming a capacitor opening over a node location, the capacitor opening having an inner insulative sidewall surface area;

forming a column of insulative material within the capacitor opening and spaced from the insulative inner sidewall surface area; and with the insulative material column in place, depositing a first capacitor plate layer within the capacitor opening and on at least some of the inner insulative sidewall surface area and over at least some of the insulative material column.

12. The method of forming a capacitor of claim 11, wherein the forming of the column of insulative material comprises forming at least a portion of the column to be tubular.

13. The method of forming a capacitor of claim 11, wherein the forming of the column of insulative material comprises forming an elongate column having a non-circular transverse cross section.

14. The method of forming a capacitor of claim 11, wherein the forming of the column of insulative material comprises forming an elongate column at least a portion of which being tubular.

15. The method of forming a capacitor of claim 11, wherein the forming of the column of insulative material comprises forming an elongate column at least a portion of which being tubular, the column having a non-circular transverse cross section.

16. The method of forming a capacitor of claim 11 further comprising prior to the forming of the column, forming a conductive pocket of material within the capacitor opening, at least some of the conductive pocket making electrical connection with the node location and supporting the column of insulative material.

17. The method of forming a capacitor of claim 11, wherein the forming of the column of insulative material comprises:
forming insulative material within the capacitor opening; and
anisotropically etching the insulative material to form a tubular column of insulative material within the capacitor opening.

18. The method of forming a capacitor of claim 11, wherein the forming of the column of insulative material comprises:
forming insulative material within the capacitor opening; and
anisotropically etching the insulative material to form a tubular column of insulative material within the capacitor opening; and further comprising:
forming a layer comprising conductive material over the substrate and to within said tubular column, said layer making electrical connection with said node location.

19. A method of forming a capacitor comprising:
forming a capacitor opening over a node location, the capacitor opening having an inner sidewall surface area;

forming a column of insulative material within the capacitor opening and spaced from the inner sidewall surface area; and with the insulative material column in place, forming a first capacitor plate structure within the capacitor opening and over at least some of the inner sidewall surface area and at least some of the insulative material column;

prior to the forming of the column, forming a conductive pocket of material within the capacitor opening, at least one portion of the conductive pocket making electrical connection with the node location and supporting the column of insulative material; and after the forming of the column, selectively removing conductive material relative to the insulative material column to expose a column surface laterally adjacent the capacitor opening inner sidewall surface area.

20. The method of forming a capacitor of claim 11, wherein the forming of the column of insulative material comprises forming at least a portion of the column to be tubular, the column portion having an inside surface; and
wherein the forming of the first capacitor plate structure comprises forming at least some of the plate structure over the column portion inside surface.

21. A method of forming a capacitor comprising:

forming a capacitor opening over a node location, the capacitor opening having an inner sidewall surface area;

forming conductive material within the capacitor opening over the inner sidewall surface area and in electrical connection with the node location;

forming a support structure comprising insulative material within the capacitor opening and laterally spaced from the inner sidewall surface area;

exposing at least some of the inner sidewall surface area and at least a portion of the support structure; and forming a first capacitor plate structure within the capacitor opening and over at least some of said exposed inner sidewall surface area and over at least some of said exposed support structure.

22. The method of forming a capacitor of claim 21, wherein the exposing of the inner sidewall surface area and the support structure comprises selectively etching the conductive material relative to the insulative material and to a degree sufficient to leave at least some conductive material laterally outward of the support structure.

23. The method of forming a capacitor of claim 21, wherein:

the forming of the conductive material comprises leaving a void laterally adjacent at least a portion of the inner sidewall surface area; and the forming of the support structure comprises depositing insulative material within at least a portion of the void.

24. The method of forming a capacitor of claim 21, wherein:

the forming of the conductive material comprises forming a layer comprising conductive material within the capacitor opening and leaving a void laterally adjacent at least a portion of the inner sidewall surface area;

the forming of the support structure comprises depositing insulative material within at least a portion of the void; and the exposing of the inner sidewall surface area and the support structure comprises selectively etching the conductive material relative to the insulative material and to a degree sufficient to leave at least some conductive material laterally outward of the support structure.

25. The method of forming a capacitor of claim 21, wherein:

the forming of the conductive material comprises forming a layer comprising conductive material within the capacitor opening, said layer occupying less than all of the capacitor opening and leaving a void laterally adjacent at least a portion of the inner sidewall surface area;

the forming of the support structure comprises depositing insulative material within at least a portion of the void;

after the depositing of the insulative material, anisotropically etching the insulative material to leave at least some insulative material over the conductive material; and the exposing of the inner sidewall surface area and the support structure comprises selectively etching the conductive material relative to the insulative material and to a degree sufficient to leave at least some conductive material laterally outward of the support structure.

26. A method of forming a capacitor support surface comprising:

forming a conductive female receptacle within a capacitor opening over a substrate node location;

forming a male projection of insulative material within the female receptacle; and removing an amount of conductive female receptacle material sufficient to leave a male insulative material portion outwardly supported by unremoved conductive female receptacle material, and to define a protuberant male insulative material portion extending elevationally outwardly of the unremoved female receptacle material.

27. The method of forming a capacitor of claim 26, wherein:

the forming of the conductive female receptacle comprises forming a layer comprising polysilicon material within the capacitor opening;

the forming of the male projection comprises forming the projection from an oxide of silicon; and the removing of the amount of conductive female receptacle material comprises selectively etching the polysilicon material relative to the oxide of silicon.

28. The method of forming a capacitor of claim 26, wherein:

the forming of the conductive female receptacle comprises forming a layer comprising polysilicon material within the capacitor opening;

the forming of the male projection comprises forming the projection from a nitride of silicon; and the removing of the amount of conductive female receptacle material comprises selectively etching the polysilicon material relative to the nitride of silicon.

29. The method of forming a capacitor of claim 26, wherein the forming of the male projection comprises completely filling the female receptacle with insulative material.

30. The method of forming a capacitor of claim 26, wherein the forming of the male projection comprises partially filling the female receptacle with insulative material, the filling defining a tubular projection having an interior surface; and further comprising:

forming a first capacitor plate structure within the capacitor opening and over the exposed protuberant male insulative material portion and over at least a portion of the tubular projection interior surface.

31. A method of forming a capacitor comprising:

forming a capacitor opening to a substrate node location, the capacitor opening having a sidewall surface area;

forming conductive material within the capacitor opening, the conductive material being in electrical connection with the substrate node location and having a conductive surface elevationally spaced from the node location;

forming an insulative support structure within the capacitor opening to extend both elevationally above and below the conductive surface of the conductive material, the support structure being supported by the conductive material relative to and in a spaced apart relationship with the capacitor opening sidewall surface area;

forming a first capacitor plate structure within the capacitor opening and over the insulative support structure; and forming a capacitor dielectric layer and second capacitor plate structure operatively adjacent the first capacitor plate structure and over at least a portion of the insulative support structure.

32. A method of forming a capacitor comprising:

forming a capacitor opening to a substrate node location, the capacitor opening having a sidewall surface area;

forming conductive material within the capacitor opening the conductive material being in electrical connection with the substrate node location and having a conductive surface elevationally spaced from the node location;

forming an insulative support structure within the capacitor opening to extend both elevationally above and below the conductive surface of the conductive material, the support structure being supported by the conductive material relative to and in a spaced apart relationship with the capacitor opening sidewall surface area;

forming a first capacitor plate structure within the capacitor opening and over the insulative support structure; and after the forming of the insulative material, selectively etching the conductive material relative to the insulative material.

33. A method of forming a capacitor comprising:

forming a capacitor opening to a substrate node location, the capacitor opening having a sidewall surface area;

forming conductive material within the capacitor opening, the conductive material being in electrical connection with the substrate node location and having a conductive surface elevationally spaced from the node location;

forming an insulative support structure within the capacitor opening to extend both elevationally above and below the conductive surface of the conductive material, the support structure being supported by the conductive material relative to and in a spaced apart relationship with the capacitor opening sidewall surface area;

forming a first capacitor plate structure within the capacitor opening and over the insulative support structure;

the forming of the conductive material comprises forming a conductive layer within the capacitor opening, the layer having at least one sidewall;

the forming of the insulative support structure comprises:
  forming insulative material adjacent the conductive layer and over the at least one sidewall thereof;
  etching the insulative material to provide a spacer over the at least one sidewall; and
  after the etching of the insulative material, selectively etching the conductive layer relative to the insulative material and from adjacent the insulative material.

34. A method of forming a capacitor comprising:

supporting an insulative column of material interiorly of a capacitor opening with conductive material which forms an electrical connection with a substrate diffusion region, at least a portion of the insulative column extending a selected distance elevationally below a conductive material upper surface;

forming a first capacitor plate structure within the capacitor opening and over at least some of the insulative column; and forming a capacitor dielectric layer and second capacitor plate structure operatively adjacent the first capacitor plate structure and over at least some of the insulative support column.

35. A method of forming a capacitor comprising:

supporting an insulative column of material interiorly of a capacitor opening with conductive material which forms an electrical connection with a substrate diffusion region, at least a portion of the insulative column extending a selected distance elevationally below a conductive material upper surface; and forming a first capacitor plate structure within the capacitor opening and over at least some of the insulative column; and further comprising prior to the supporting of the insulative column:
  forming a conductive material layer within the capacitor opening, the conductive material layer occupying less than the entire capacitor opening;
  forming insulative material within the capacitor opening and over at least some of the conductive material layer; and
  selectively etching material of the conductive material layer relative to the insulative material to provide the insulative column and conductive material upper surface.

36. A method of forming a capacitor comprising:

supporting an insulative column of material interiorly of a capacitor opening with conductive material which forms an electrical connection with a substrate diffusion region, at least a portion of the insulative column extending a selected distance elevationally below a conductive material upper surface; and forming a first capacitor plate structure within the capacitor opening and over at least some of the insulative column; and further comprising prior to the supporting of the insulative column:
  forming a conductive material layer within the capacitor opening, the conductive material layer occupying less than the entire capacitor opening;
  forming insulative material within the capacitor opening and over at least some of the conductive material layer;
  removing some material of the insulative material layer; and
  selectively etching material of the conductive material layer relative to the insulative material to provide the insulative column and conductive material upper surface.

37. A method of forming a capacitor comprising:

forming an upright insulative structure internally of a capacitor opening, the insulative structure having a lateral outer sidewall surface elevationally outwardly of an insulative structure bottom portion;

supporting the insulative structure bottom portion and at least a portion of the lateral outer sidewall surface with conductive material which forms an electrical connection with a substrate node location;

forming a first capacitor plate structure within the capacitor opening and over the lateral outer sidewall surface which is unsupported with any conductive material; and forming a capacitor dielectric layer and second capacitor plate structure operatively adjacent the first capacitor plate structure and over at least some of the insulative structure.

38. The method claim 37, wherein:

the forming of the insulative structure comprises forming a tubular structure having an interior surface; and the forming of the first capacitor plate structure comprises forming at least some of the first capacitor plate structure over the tubular structure interior surface.

39. A method of forming a capacitor comprising:

forming an upright insulative structure internally of a capacitor opening, the insulative structure having a lateral outer sidewall surface elevationally outwardly of an insulative structure bottom portion;

supporting the insulative structure bottom portion and at least a portion of the lateral outer sidewall surface with conductive material which forms an electrical connection with a substrate node location;

forming a first capacitor plate structure within the capacitor opening and over the lateral outer sidewall surface which is unsupported with any conductive material; and the forming of the insulative structure comprises forming an insulative structure interior region which is substantially filled with insulative material.

40. A method of forming a capacitor comprising:

forming an upright insulative structure internally of a capacitor opening, the insulative structure having a lateral outer sidewall surface elevationally outwardly of an insulative structure bottom portion;

supporting the insulative structure bottom portion and at least a portion of the lateral outer sidewall surface with conductive material which forms an electrical connection with a substrate node location;

forming a first capacitor plate structure within the capacitor opening and over the lateral outer sidewall surface which is unsupported with any conductive material; and the supporting of the insulative structure comprises:
 prior to forming the insulative structure, forming a layer comprising conductive material within the capacitor opening, the insulative structure being subsequently formed relative to and in contact with the conductive material layer; and
 selectively etching the conductive material layer relative to the insulative structure.

41. A method of forming a capacitor comprising:

forming an insulative sidewall defining a capacitor opening elevationally over a substrate node location;

forming an insulative surface inward of the insulative sidewall, the insulative surface having an area;

supporting at least a portion of the insulative surface area with conductive material which extends between the insulative surface area and the insulative sidewall and which makes electrical connection with the substrate node location;

forming a first capacitor plate structure within the capacitor opening and over at least some of the insulative surface; and forming a capacitor dielectric layer and second capacitor plate structure operatively adjacent the first capacitor plate structure and over at least some of the insulative surface.

42. The method of claim 41, wherein the forming of the insulative surface comprises forming a column of insulative material, the insulative surface comprising an outside surface of the column.

43. The method of claim 41, wherein the forming of the insulative surface comprises forming a tubular column of insulative material, the insulative surface comprising an outside surface of the column.

44. The method of claim 41, wherein the forming of the insulative surface comprises forming a column of insulative material at least a portion of which being tubular, the insulative surface comprising an outside surface of the column.

45. The method of claim 41, wherein the forming of the insulative surface comprises forming a tubular column of insulative material, the insulative surface comprising an inside surface of the tubular column.

46. The method of claim 41, wherein the forming of the insulative surface comprises forming a tubular column of insulative material, the insulative surface comprising both inside and outside surfaces of the tubular column.

47. A method of forming a capacitor comprising:

forming a capacitor opening over a node location;

forming electrically conductive material within the capacitor opening and in electrical connection with the node location, the conductive material having an upper substantially planar surface extending from one side of the capacitor opening to an opposing side of the capacitor opening;

forming a protuberant structure within the capacitor opening, the protuberant structure having a lateral outer surface at least a portion of which is supported by and extends elevationally below adjacent electrically conductive material;

forming a first capacitor plate structure within the capacitor opening, at least some of the first capacitor plate structure being supported by the protuberant structure; and providing a capacitor dielectric layer and second capacitor plate structure operatively adjacent the first capacitor plate structure.

* * * * *

UNITED STATES PATENT AND TRADEMARK OFFICE
CERTIFICATE OF CORRECTION

PATENT NO.   : 6,146,961
DATED        : November 14, 2000
INVENTOR(S)  : Thomas M. Graettinger, et al It is certified that error appears in the above-identified patent and that said Letters Patent are hereby corrected as shown below:

Col. 4, line 16   Replace "15%" with --5%--

Signed and Sealed this

Twenty-ninth Day of May, 2001

Attest:

NICHOLAS P. GODICI

Attesting Officer    Acting Director of the United States Patent and Trademark Office